United States Patent
Lin (10) Patent No.: US 9,197,213 B1
(45) Date of Patent: Nov. 24, 2015

(54) LEVEL SHIFTER

(71) Applicant: Winbond Electronics Corp., Taichung (TW)

(72) Inventor: Chih-Feng Lin, Zhubei (TW)

(73) Assignee: WINBOND ELECTRONICS CORP., Taichung (TW)

(*) Notice: Subject to any disclaimer, the term of this patent is extended or adjusted under 35 U.S.C. 154(b) by 0 days.

(21) Appl. No.: 14/493,742

(22) Filed: Sep. 23, 2014

(51) Int. Cl.
  *H03L 5/00* (2006.01)
  *H03K 19/0185* (2006.01)
  *H03K 5/02* (2006.01)

(52) U.S. Cl.
  CPC ............ *H03K 19/0185* (2013.01); *H03K 5/023* (2013.01)

(58) Field of Classification Search
  None
  See application file for complete search history.

(56) References Cited

U.S. PATENT DOCUMENTS

| | | | | |
|---|---|---|---|---|
| 7,239,191 B2* | 7/2007 | Lee | ................. | H03K 3/356113 327/333 |
| 7,368,947 B2* | 5/2008 | McClure | .......... | H03K 3/356113 326/68 |
| 8,030,965 B2* | 10/2011 | Kojima | ............ | H03K 3/356165 326/68 |

* cited by examiner

*Primary Examiner* — Long Nguyen
(74) *Attorney, Agent, or Firm* — Muncy, Geissler, Olds & Lowe, P.C.

(57) ABSTRACT

A level shifter includes a voltage converter having an input and an output coupled to a first node, a transistor coupled between a power node and a third node and having a gate coupled to the first node, a transistor coupled between a fourth node and a reference node and having a gate coupled to the first input node, a voltage converter having an input coupled to a second input node and an output coupled to a second node, a transistor coupled between the power node and the fourth node and having a gate coupled to a second node, a transistor coupled between the third node and the reference node and having a gate coupled to the second input node, a third inverter coupled between the third node and the fourth node and an fourth inverter coupled between the third node and the fourth node.

8 Claims, 8 Drawing Sheets

LEVEL SHIFTER

BACKGROUND OF THE INVENTION

1. Field of the Invention

The present invention relates to a level shifter and in particular to a level shifter having an enhanced slew rate.

2. Description of the Related Art

In order to avoid leakage current, in the design of a conventional level shifter, the size of the pull-down transistor is usually larger than the size of the pull-up transistor. However, in this way, the slew rate when the output voltage increases is lower than the slew rate when the output voltage decreases.

Therefore, there is a need to present a new level shifter having a characteristic wherein the slew rate when the output voltage increases is substantially equal to the slew rate when the output voltage decreases.

BRIEF SUMMARY OF THE INVENTION

In view of this, an embodiment of the invention presents a new level shifter to solve the above problems.

An exemplary embodiment of the invention presents a level shifter. The level shifter includes a first voltage converter having an input coupled to a first input node and an output coupled to a first node. The level shifter further includes a first pull-up transistor coupled between a power node and a third node and having a gate coupled to the first node. The level shifter further includes a first pull-down transistor coupled between a fourth node and a reference node and having a gate coupled to a first input node. The level shifter further includes a second voltage converter having an input coupled to a second input node and an output coupled to a second node wherein the voltage level at the second input node is opposite to the voltage level at the first input node. The level shifter further includes a second pull-up transistor coupled between the power node and the fourth node and having a gate coupled to a second node. The level shifter further includes a second pull-down transistor coupled between the third node and the reference node and having a gate coupled to a second input node. The level shifter further includes a third inverter having an input coupled to the third node and an output coupled to the fourth node. The level shifter further includes a fourth inverter having an input coupled to the fourth node and an output coupled to the third node.

In a preferred embodiment of the invention, the third inverter of the aforementioned level shifter includes a first transistor coupled between the power node and the fourth node and having a gate coupled to the third node. The third inverter further includes a second transistor coupled between the fourth node and the reference node and having a gate coupled to the third node. The fourth inverter of the aforementioned level shifter includes a third transistor coupled between the power node and the third node and having a gate coupled to the fourth node. The fourth inverter further includes a fourth transistor coupled between the third node and the reference node and having a gate coupled to the fourth node.

In a preferred embodiment of the invention, the aforementioned first voltage converter includes a fifth transistor coupled between the power node and the first node and having a gate coupled to the first input node. The aforementioned first voltage converter further includes a sixth transistor coupled between the first node and a fifth node and having a gate coupled to a first output node, wherein the voltage level at the first output node is opposite to the voltage level at the third node. The aforementioned first voltage converter further includes a seventh transistor coupled between the fifth node and the reference node and having a gate coupled to the first output node. The aforementioned second voltage converter includes an eighth transistor coupled between the power node and the second node and having a gate coupled to the second input node. The aforementioned second voltage converter further includes a ninth transistor coupled between the second node and a sixth node and having a gate coupled to a second output node, wherein the voltage level at the second output node is opposite to the voltage level at the fourth node. The aforementioned second voltage converter further includes a tenth transistor coupled between the sixth node and the reference node and having a gate coupled to the second input node.

In a preferred embodiment of the invention, the aforementioned level shifter further includes an input inverter having an input coupled to the first input node and an output coupled to the second input node. The aforementioned level shifter further includes a first output inverter having an input coupled to the third node and an output coupled to the first output node. The aforementioned level shifter further includes a second output inverter, having an input coupled to the fourth node and an output coupled to the second output node.

The aforementioned level shifter of the invention has a characteristic wherein the slew rate when the output voltage increases is substantially equal to the slew rate when the output voltage decreases.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The claimed subject matter is now described with reference to the drawings, wherein like reference numerals are generally used to refer to like elements throughout. In the following description, for purposes of explanation, numerous specific details are set forth in order to provide an understanding of the claimed subject matter. It is evident, however, that the claimed subject matter may be practiced without these specific details. In other instances, structures and devices are illustrated in block diagram form in order to facilitate describing the claimed subject matter.

Figure 1A:
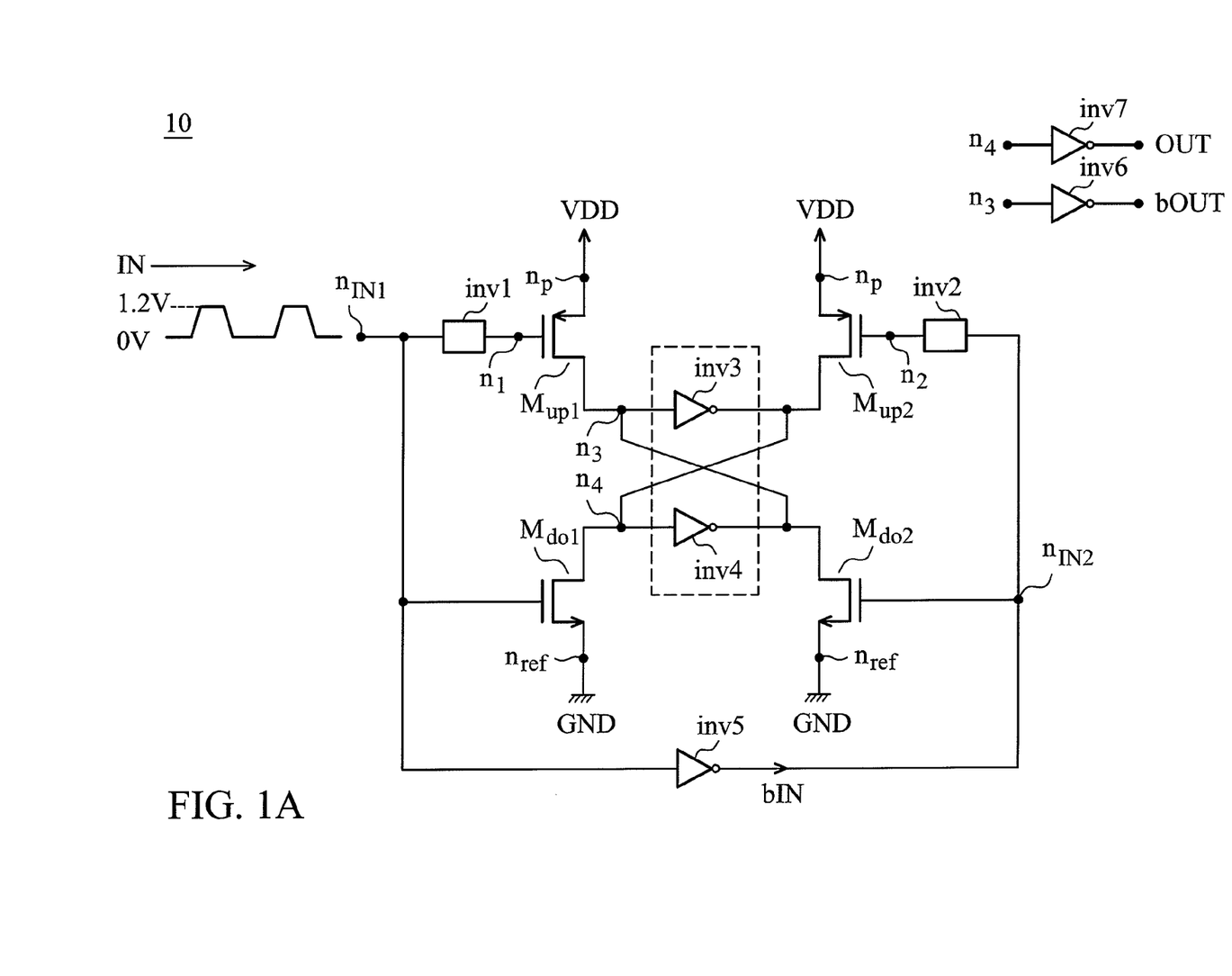
FIG. 1A is a circuit structure diagram of a level shifter, according to an exemplary embodiment of the invention.

FIG. 1A is a circuit structure diagram of a level shifter 10, according to an exemplary embodiment of the invention. The level shifter 10 comprises a first voltage converter inv1, a second voltage converter inv2, a third inverter inv3, a fourth inverter inv4, an input inverter inv5, a first output inverter inv6, a second output inverter inv7, a first pull-up transistor $M_{up1}$, a first pull-down transistor $M_{do1}$, a second pull-up transistor $M_{up2}$ and a second pull-down transistor $M_{do2}$.

The first voltage converter inv1 has an input coupled to a first input node $n_{IN1}$, and an output coupled to a first node $n_1$ and a gate of the first pull-up transistor $M_{up1}$. The first voltage converter inv1 is arranged to receive an input signal IN, and to output a signal, which is opposite to the input signal IN, to the gate of the first pull-up transistor $M_{up1}$. For example, the input signal is a clock signal, as shown in the figure. The high voltage level of the clock signal is 1.2 V, and the low voltage level of the clock signal is 0 V.

The first pull-up transistor $M_{up1}$ is coupled between a power node $n_p$ and a third node $n_3$, and has a gate coupled to the first node $n_1$. The first pull-up transistor $M_{up1}$ is coupled to a voltage source $V_{DD}$ via the power node $n_p$. For example, the voltage level of the voltage source $V_{DD}$ is 1.8 V.

The first pull-down transistor $M_{do1}$ is coupled between a fourth node $n_4$ and a reference node $n_{ref}$, and has a gate coupled to the first input node $n_{IN1}$. The first pull-down transistor $M_{do1}$ is coupled to a reference ground GND via the reference node $n_{ref}$. For example, the voltage level of the reference ground GND is 0 V.

The input inverter inv5 has an input coupled to the first input node $n_{IN1}$ and an output coupled to a second input node $n_{IN2}$. The input inverter inv5 is arranged to receive the input signal IN and arranged to output a signal bIN, which is opposite to the input signal IN, to the second voltage converter inv2 and a gate of the second pull-down transistor $M_{do2}$.

The second voltage converter inv2 has an input coupled to a second input node $n_{IN2}$, and has an output coupled to a second node $n_2$ and the gate of the second pull-up transistor $M_{up2}$. The second voltage converter inv2 is arranged to receive the signal bIN, and is arranged to output a signal, which is opposite to the signal bIN, to the gate of the second pull-up transistor $M_{up2}$.

The second pull-up transistor $M_{up2}$ is coupled between the power node $n_p$ and the fourth node $n_4$, and has a gate coupled to the second node $n_2$. The second pull-up transistor $M_{up2}$ is coupled to the voltage source $V_{DD}$ via the power node $n_p$.

The second pull-down transistor $M_{do2}$ is coupled between the third node $n_3$ and the reference node $n_{ref}$, and has a gate coupled to a second input node $n_{IN2}$. The second pull-down transistor $M_{do2}$ is coupled to the reference ground GND via the reference node $n_{ref}$.

The third inverter inv3 has an input coupled to the third node $n_3$ and an output of the fourth inverter inv4. The third inverter inv3 and has an output coupled to the fourth node $n_4$ and an input of the fourth inverter inv4.

The fourth inverter inv4 has the input coupled to the fourth node $n_4$ and the output of the third inverter inv3. The fourth inverter inv4 has the output coupled to the third node $n_3$ and the input of the third inverter inv3.

The first output inverter inv6 has an input coupled to the third node $n_3$ and an output coupled to a first output node bOUT wherein the voltage level at the third node $n_3$ is opposite to the voltage level at the first output node bOUT.

The second output inverter inv7 has an input coupled to the fourth node $n_4$ and an output coupled to the second output node OUT wherein the voltage level at the fourth node $n_4$ is opposite to the voltage level at the second output node OUT.

Figure 1B:
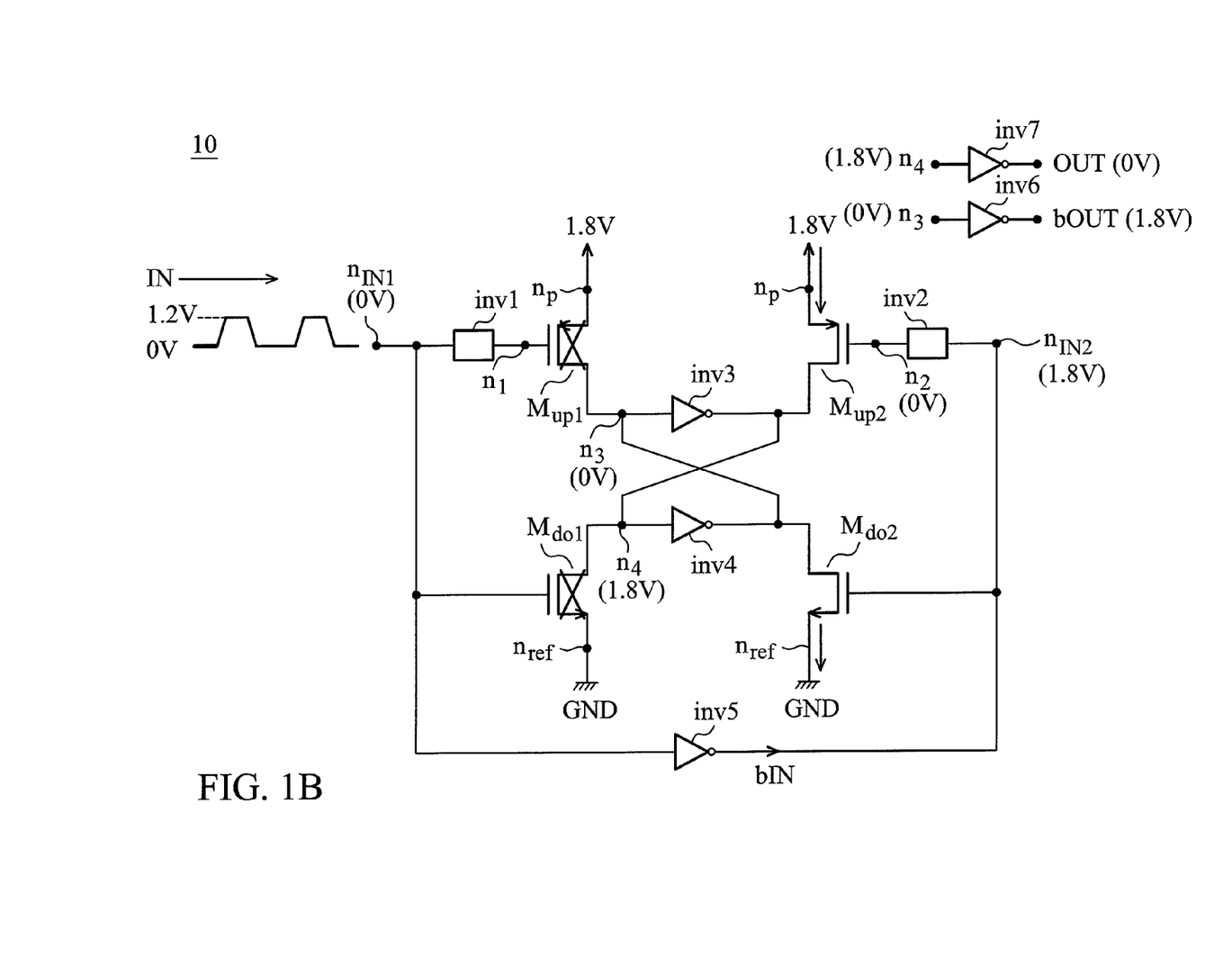
FIG. 1B is a diagram illustrating the operation of the level shifter of FIG. 1A when a clock signal is at a low voltage level.
Figure 1C:
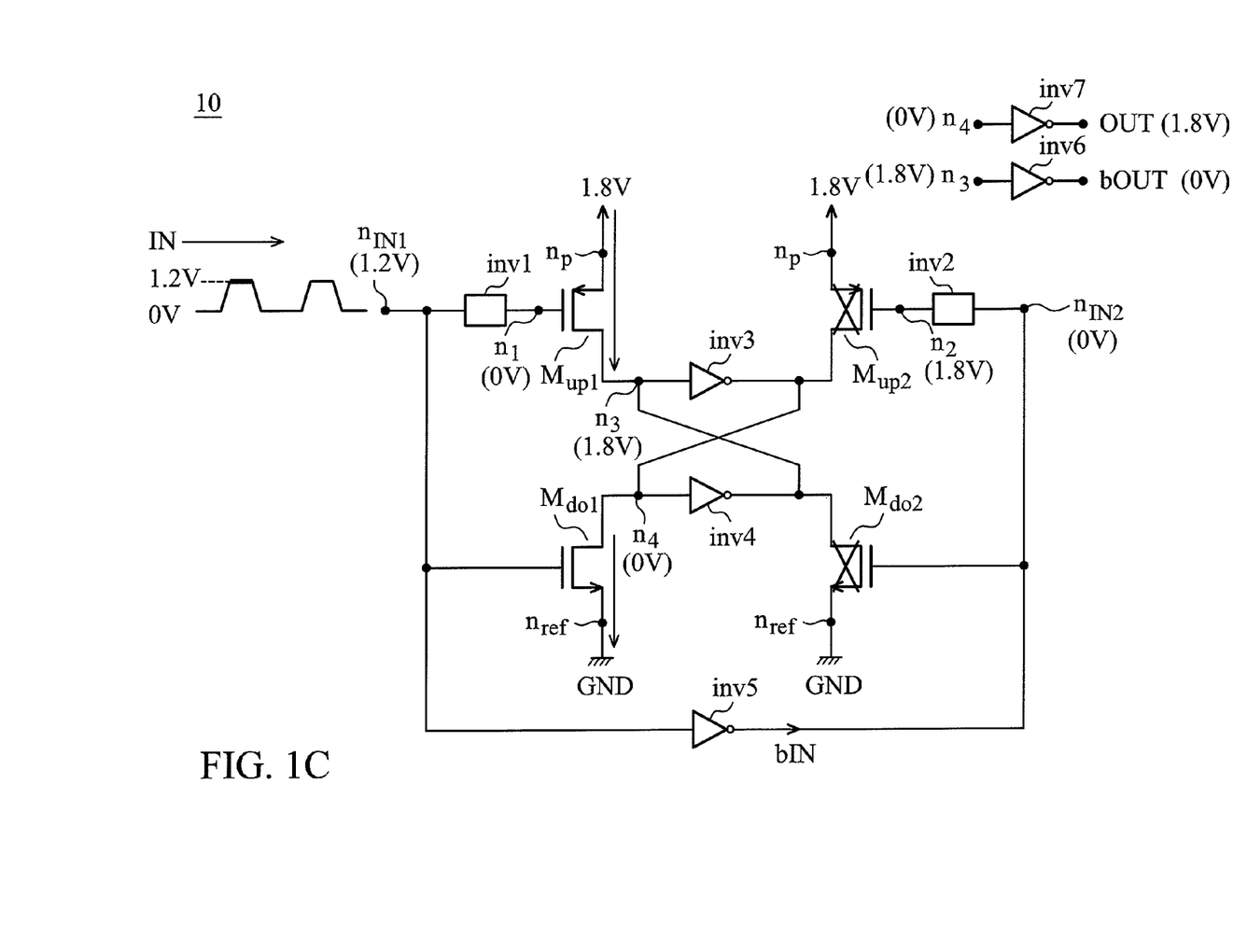
FIG. 1C is a diagram illustrating an operation of the level shifter of FIG. 1A when the clock signal is at a high voltage level.

FIG. 1B is a diagram illustrating an operation of the level shifter of FIG. 1A when a clock signal is at a low voltage level. FIG. 1C is a diagram illustrating an operation of the level shifter of FIG. 1A when the clock signal is at a high voltage level. In FIG. 1B and FIG. 1C, it is assumed that the voltage level of the voltage source $V_{DD}$ is 1.8 V and the saturation voltage of each of the first voltage converter inv1, the second voltage converter inv2, the third inverter inv3, the fourth inverter inv4, the first output inverter inv6 and the second output inverter inv7 is 1.8 V; the saturation voltage of the input inverter inv5 is 1.2 V; the high voltage level and the low voltage level of the clock signal is 1.2 V and 0 V, respectively.

Referring to FIG. 1B, at this time, the voltage level of the clock signal is 0 V. The input inverter inv5 reverses the voltage level from 0 V to 1.8 V, and thereafter outputs 1.8 V to the second voltage converter inv2 and the gate of the second pull-down transistor $M_{do2}$. The second voltage converter inv2 reverses the voltage level from 1.8 V to 0 V, and thereafter outputs 0 V to the gate of the second pull-up transistor $M_{up2}$. The second pull-up transistor $M_{up2}$ conducts, and thereby the voltage source $V_{DD}$ increases the voltage level at the fourth node $n_4$ to 1.8 V via the second pull-up transistor $M_{up2}$, such that the voltage level at the second output node OUT is decreased to 0 V. Furthermore, the second pull-down transistor $M_{do2}$ conducts, and thereby the reference ground GND decreases the voltage level at the third node $n_3$ to 0 V via the second pull-down transistor $M_{do2}$, such that the voltage level at the first output node bOUT is increased to 1.8 V.

Referring to FIG. 1C, at this time, the voltage level of the clock signal is 1.2 V. The first voltage converter inv1 reverses the voltage level from 1.2 V to 0 V, and thereafter outputs 0 V to the gate of the first pull-up transistor $M_{up1}$. The first pull-up transistor $M_{up1}$ conducts, and the voltage source $V_{DD}$ increases the voltage level at the third node $n_3$ to 1.8 V via the first pull-up transistor $M_{up1}$. The first pull-down transistor $M_{do1}$ conducts, and thereby the reference ground GND decreases the voltage level at the fourth node $n_4$ to 0 V via the first pull-down transistor $M_{do1}$, such that the voltage level at the second output node OUT is increased to 1.8 V.

In a specific embodiment, the first pull-up transistor $M_{up1}$ and the second pull-up transistor $M_{up2}$ are PMOS transistors, and the first pull-down transistor $M_{do1}$ and the second pull-down transistor $M_{do2}$ are NMOS transistors. Moreover, the size of the first pull-up transistor $M_{up1}$ and the second pull-up transistor $M_{up2}$ is equal to the size of the first pull-down transistor $M_{do1}$ and the second pull-down transistor $M_{do2}$. In this design, using the voltage variation at the fourth node $n_4$ as an example, the voltage level at the fourth node $n_4$ is increased via the second pull-up transistor $M_{up2}$, and is decreased via the first pull-down transistor $M_{do1}$. Due to the second pull-up transistor $M_{up2}$ and the first pull-down transistor $M_{do1}$ being the same size, the increasing speed of the voltage level at the fourth node $n_4$ is substantially equal to the decreasing speed of the voltage level at the fourth node $n_4$. The voltage level at the fourth node $n_4$ is opposite to the voltage level at the second output node OUT, and therefore it is realized that the slew rate when the second output node OUT increases is substantially equal to the slew rate when the second output node OUT decreases.

Figure 1D:
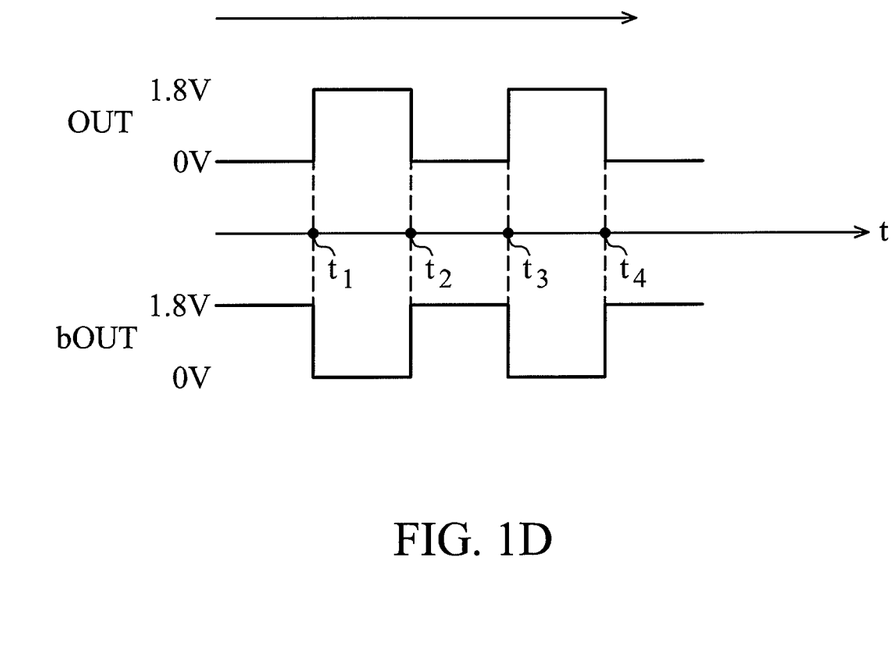
FIG. 1D is a wave form at the output nodes of the level shifter of FIG. 1A.

Furthermore, the level shifter of FIG. 1A has two-terminal output (coupled to the first output node bOUT and the second output node OUT). Due to the bilateral symmetry of the circuit structure, at the same time point, the wave forms at the two output nodes are the same but the voltage levels are opposite. FIG. 1D is a wave form at the output nodes of the level shifter of FIG. 1A. Specifically, as shown in FIG. 1D, at time t1, the voltage level at the second output node OUT is increased from 0 V to 1.8 V, the voltage level at the first output node bOUT is decreased from 1.8 V to 0 V. At time t2, the voltage level at the second output node OUT is decreased from 1.8 V to 0 V, and the voltage level at the first output node bOUT is increased from 0 V to 1.8 V. In other words, in time series, the voltage levels of the two output nodes are changed substantially at the same time.

Figure 2:
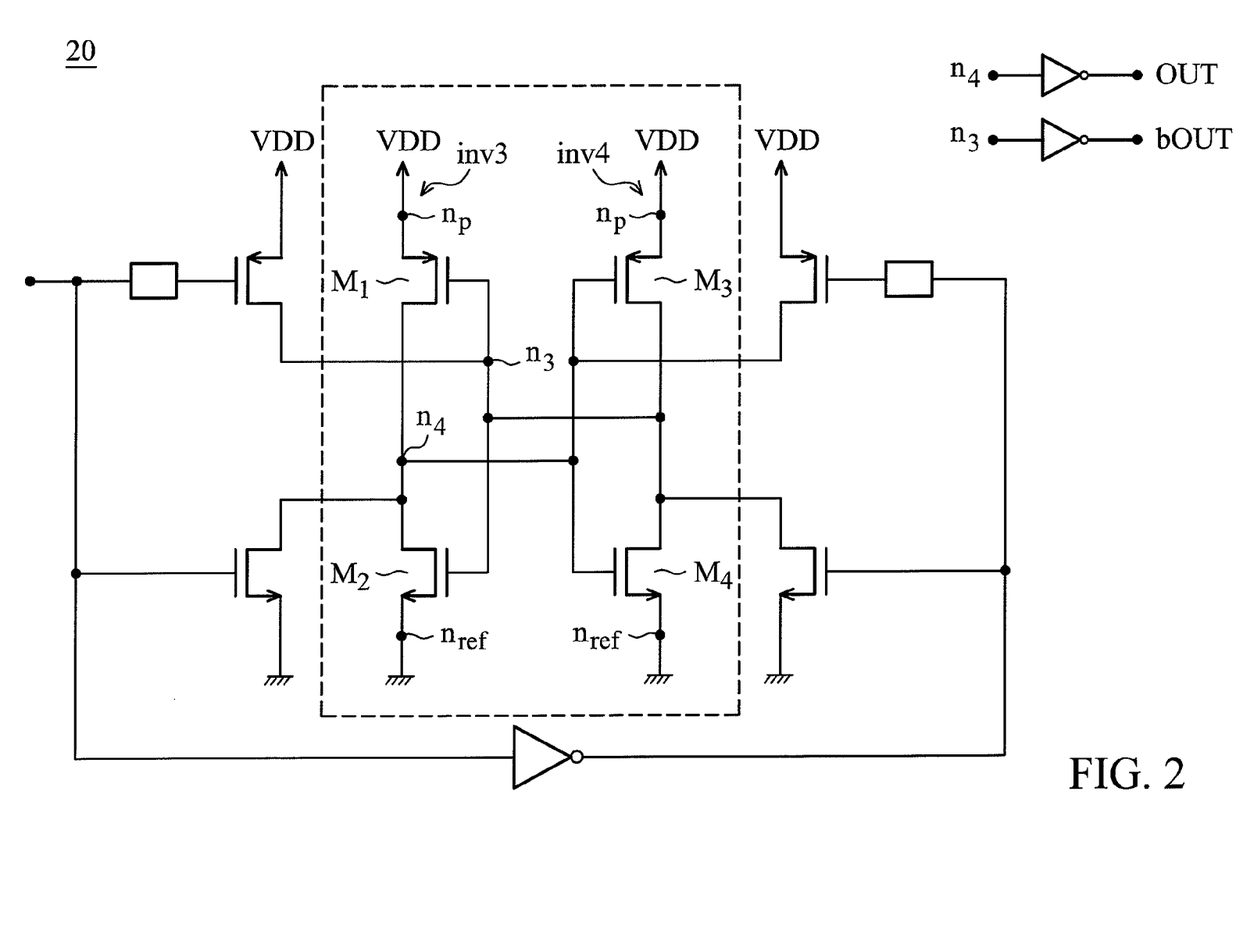
FIG. 2 illustrates a level shifter, according to an exemplary embodiment of the invention.

FIG. 2 illustrates a level shifter, according to an exemplary embodiment of the invention. The difference between FIG. 2 and FIG. 1A is that the level shifter 20 of FIG. 1 further discloses the circuit structure of both the third inverter inv3 and the fourth inverter inv4. For simplicity, symbols of the components of FIG. 2 are omitted if the components of FIG. 2 are the same as the components of FIG. 1A.

The third inverter inv3 comprises a first transistor $M_1$ and a second transistor $M_2$. The first transistor $M_1$ is coupled between the power node $n_p$ and the fourth node $n_4$, and has a gate coupled to the third node $n_3$. The second transistor $M_2$ is coupled between the fourth node $n_4$ and the reference node $n_{ref}$, and has a gate coupled to the third node $n_3$.

The fourth inverter inv4 comprises a third transistor $M_3$ and a fourth transistor $M_4$. The third transistor $M_3$ is coupled between the power node $n_p$ and the third node $n_3$, and has a gate coupled to the fourth node $n_4$. The fourth transistor $M_4$ is coupled between the third node $n_3$ and the reference node $n_{ref}$, and has a gate coupled to the fourth node $n_4$.

Figure 3A:
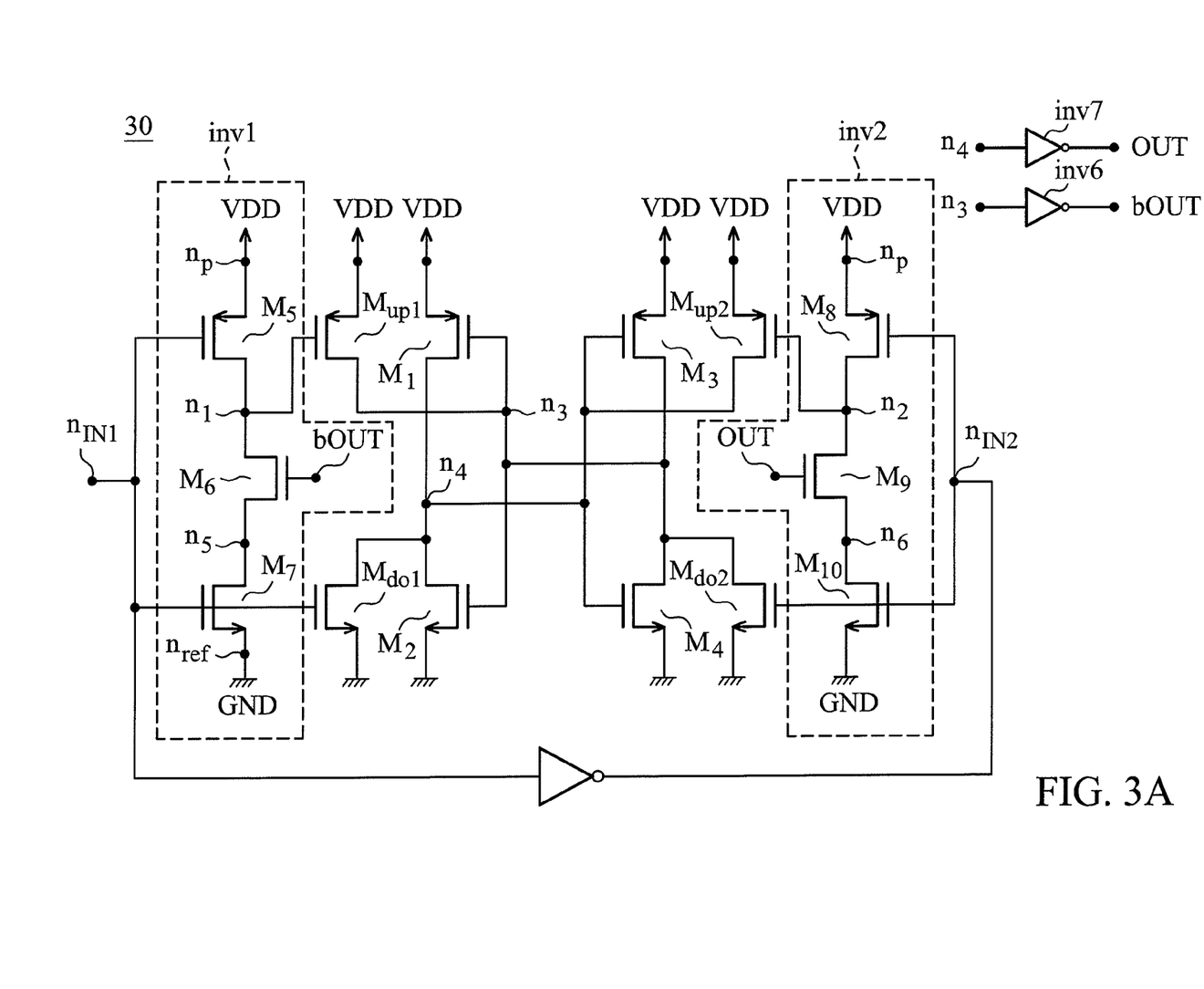
FIG. 3A illustrates a level shifter, according to an exemplary embodiment of the invention.

FIG. 3A illustrates a level shifter, according to an exemplary embodiment of the invention. The difference between FIG. 3A and FIG. 2 is that the level shifter 30 of FIG. 3A further discloses the circuit structure of the first voltage converter inv1 and the second voltage converter inv2.

The first voltage converter inv1 comprises a fifth transistor $M_5$, a sixth transistor $M_6$ and a seventh transistor $M_7$. The fifth transistor $M_5$ is coupled between the power node $n_p$ and the first node $n_1$ and has a gate coupled to the first input node $n_{IN1}$. The sixth transistor $M_6$ is coupled between the first node $n_1$ and a fifth node $n_5$ and has a gate coupled to a first output node bOUT. The seventh transistor $M_7$ is coupled between the fifth node $M_5$ and the reference node $n_{ref}$ and has a gate coupled to the first input node $n_{IN1}$.

The second voltage converter inv2 comprises an eighth transistor $M_8$, a ninth transistor $M_9$ and a tenth transistor $M_{10}$. The eighth transistor $M_8$ is coupled between the power node $n_p$ and the second node $n_2$ and has a gate coupled to the second input node $n_{IN2}$. The ninth transistor $M_9$ is coupled between the second node $n_2$ and a sixth node $n_6$ and has a gate coupled to a second output node OUT. The tenth transistor $M_{10}$ is coupled between the sixth node $n_6$ and the reference node $n_{ref}$ and has a gate coupled to the second input node $n_{IN2}$.

Figure 3B:
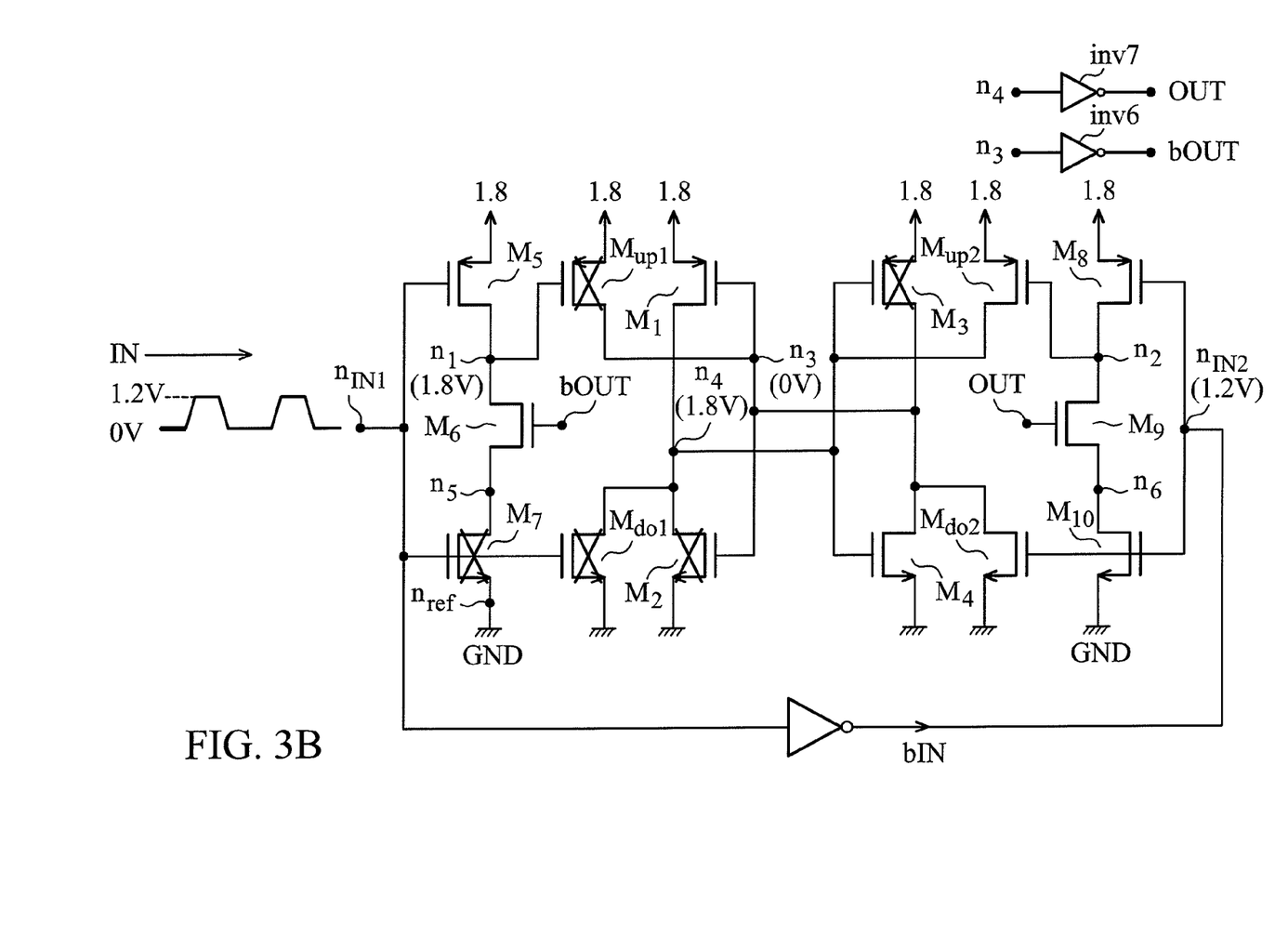
FIG. 3B is a diagram illustrating an operation of the level shifter of FIG. 3A when a clock signal is at a low voltage level.
Figure 3C:
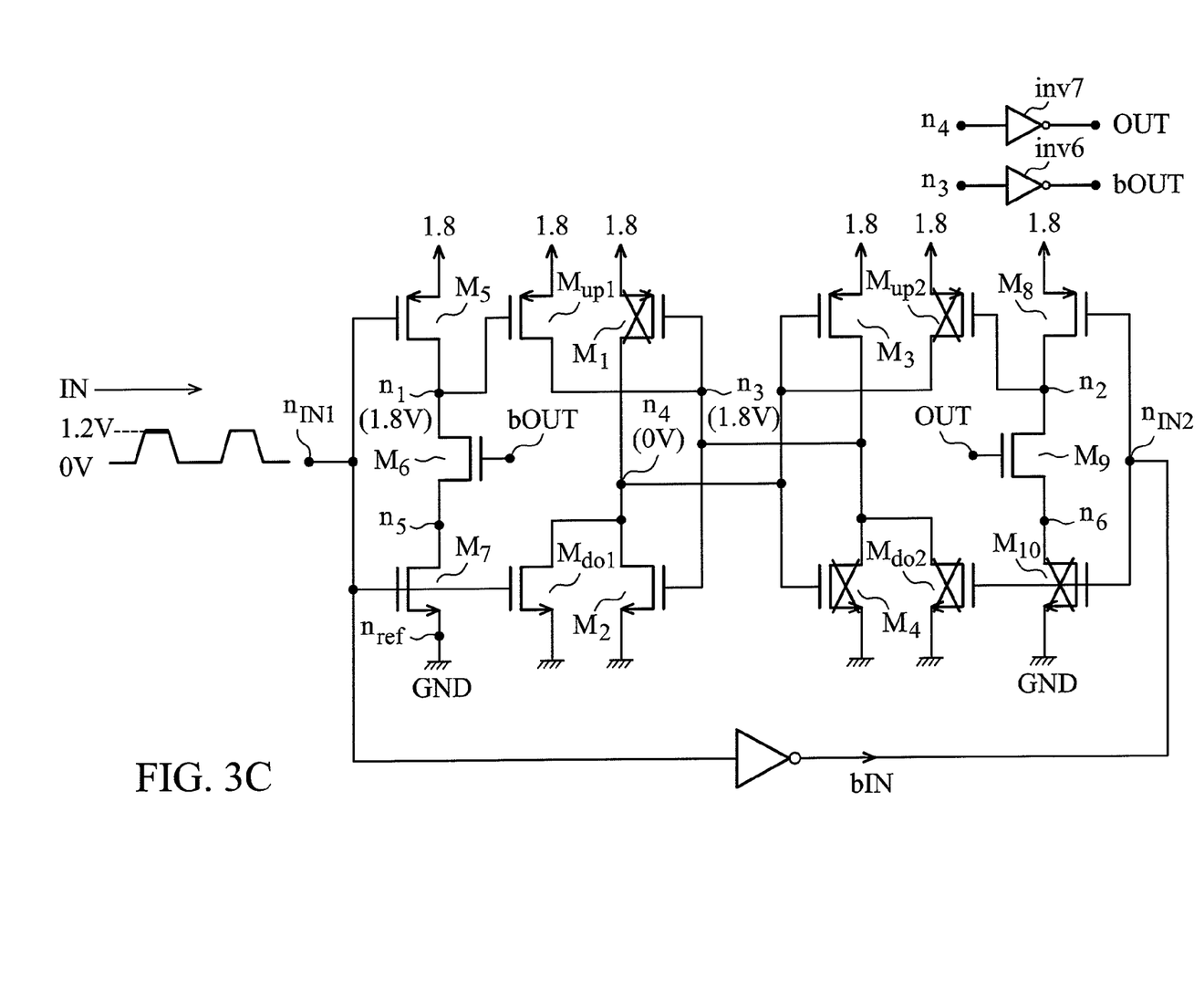
FIG. 3C is a diagram illustrating an operation of the level shifter of FIG. 3A when the clock signal is at a high voltage level.

FIG. 3B is a diagram illustrating an operation of the level shifter of FIG. 3A under a stable state when a clock signal is at a low voltage level. FIG. 3C is a diagram illustrating an operation of the level shifter of FIG. 3A under a stable state when the clock signal is at a high voltage level. In FIG. 3B and FIG. 3C, it is assumed that the voltage level at the voltage source $V_{DD}$ is 1.8 V; the saturation voltage of each of the first output inverter inv6 and the second output inverter inv7 is 1.8 V; the saturation voltage of the input inverter inv5 is 1.2 V; the high voltage level and the low voltage level of the clock signal is 1.2 V and 0 V, respectively. The operation of the level shifter 30 wherein the operation is performed when the voltage level of the clock signal is increased from 0 V to 1.2 V is further described below.

Referring to FIG. 3B, at this time, the voltage level of the clock signal is 0 V and the voltage level at the second input node $n_{IN2}$ is 1.2 V. In a stable state, the second pull-down transistor $M_{do2}$ conducts, and the voltage level at the third node $n_3$ is 0 V. Furthermore the second pull-up transistor $M_{up2}$ conducts, the voltage level at the fourth node $n_4$ is 1.8 V.

Afterwards, the voltage level of the clock signal is increased from 0 V to 1.2 V (the transient state for the operation of the level shifter is not shown in the figure). The voltage source $V_{DD}$ increases the voltage level at the third node $n_3$ via the first pull-up transistor $M_{up1}$ when the voltage level at the first input node $n_{IN1}$ is higher than a first voltage level, such that the time required for the voltage level at the second output node OUT to rise is being shortened. The voltage level at the fourth node $n_4$ is gradually decreased correspondingly when the voltage level at the third node $n_3$ is gradually increased, such that the third transistor $M_3$ whose gate is coupled to the fourth node $n_4$ conducts for keeping the voltage level at the third node $n_3$ in 1.8 V.

Referring to FIG. 3C, at this time, the voltage level of the clock signal has reached 1.2 V and the voltage level at the first input node $n_{IN1}$ is 1.2 V. Under the stable state, the first pull-down transistor $M_{do1}$ conducts, and the voltage level at the fourth node $n_4$ is 0 V; the first pull-up transistor $M_{up1}$ conducts, the voltage level at the third node $n_3$ is 1.8 V. At this time, the voltage level at the first output node bOUT is 0 V, such that the sixth transistor $M_6$ does not conduct, thus preventing leakage current.

Due to symmetry of the circuit structure of FIG. 3A, the operation performed by the level shifter when the voltage level of the clock signal is being decreased from 12 V to 0 V, is opposite to the operation performed by the level shifter when the voltage level of the clock signal is being increased from 0 V to 12 V. In short, the voltage source $V_{DD}$ increases the voltage level at the fourth node $n_4$ via the second pull-up transistor $M_{up2}$, such that the time required for the voltage level at the first output node bOUT to rise is being shortened.

In a specific embodiment, each of the first pull-up transistor $M_{up1}$, the second pull-up transistor $M_{up2}$, the first transistor $M_1$, the third transistor $M_3$, the fifth transistor $M_5$, and the eighth transistor $M_8$ is a PMOS transistor. Each of the first pull-down transistor $M_{do1}$, the second pull-down transistor $M_{do2}$, the second transistor $M_2$, the fourth transistor $M_4$, the sixth transistor $M_6$, the seventh transistor $M_7$, the ninth transistor $M_9$ and the tenth transistor $M_{10}$ is an NMOS transistor.

It should be noted that the size of the first pull-up transistor $M_{up1}$ and the second pull-up transistor $M_{up2}$ is substantially equal to the size of the first pull-down transistor $M_{do1}$, the second pull-down transistor $M_{do2}$, the second transistor $M_2$, the fourth transistor $M_4$, the sixth transistor $M_6$, the seventh transistor $M_7$, the ninth transistor $M_9$ and the tenth transistor $M_{10}$, and is substantially larger than the size of the first transistor $M_1$, the third transistor $M_3$, the fifth transistor $M_5$ and the eighth transistor $M_8$. In this design, using the voltage variation at the fourth node $n_4$ as an example, the voltage level at the fourth node $n_4$ is increased via the second pull-up transistor $M_{up2}$, and is decreased via the first pull-down transistor $M_{do1}$. Due to the same size between the second pull-up transistor $M_{up2}$ and the first pull-down transistor $M_{do1}$, the increasing speed of the voltage level at the fourth node $n_4$ is substantially equal to the decreasing speed of the voltage level at the fourth node $n_4$. The voltage level at the fourth node $n_4$ is opposite to the voltage level at the second output node OUT, and therefore it is realized that the slew rate when the second output node OUT increases is substantially equal to the slew rate when the second output node OUT decreases.

Moreover, due to symmetry of the circuit structure of the aforementioned level shifter of the invention, the voltage levels for both forward signal and the backward signal output by the level shifter of the invention, in time series, are changed substantially at the same time.

Although the subject matter has been described in language specific to structural features or methodological acts, it is to be understood that the subject matter of the appended claims is not necessarily limited to the specific features or acts described above. Rather, the specific features and acts described above are disclosed as exemplary forms of implementing at least some of the claims.

Various operations of embodiments are provided herein. The order in which some or all of the operations are described should not be construed as to imply that these operations are necessarily order dependent. Alternative ordering will be appreciated given the benefit of this description. Further, it will be understood that not all operations are necessarily present in each embodiment provided herein. Also, it will be understood that not all operations are necessary in some embodiments.

Further, unless specified otherwise, "first," "second," "third," "fourth," "fifth," "sixth," "seventh," "eighth," and the like are not intended to imply a temporal aspect, a spatial aspect, an ordering, etc. Rather, such terms are merely used as identifiers, names, etc. for features, elements, items, etc. For example, a first channel and a second channel generally correspond to channel A and channel B or two different or identical channels or the same channel. In an example, unless specified otherwise, the presence of a "second" does not necessarily imply the presence of a "first," the presence of a "third" does not necessarily imply the presence of a "first" or "second," the presence of a "fourth" does not necessarily imply the presence of a "first," "second," or "third," the presence of a "fifth" does not necessarily imply the presence of a "first," "second," "third," or "fourth," the presence of a "sixth" does not necessarily imply the presence of a "first," "second," "third," "fourth," or "fifth," the presence of a "seventh" does not necessarily imply the presence of a "first," "second," "third," "fourth," "fifth," or "sixth," the presence of an "eighth" does not necessarily imply the presence of a "first," "second," "third," "fourth," "fifth," "sixth," or "seventh," and the presence of a "ninth" does not necessarily imply the presence of a "first," "second," "third," "fourth," "fifth," "sixth," "seventh," or "eighth."

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application are generally be construed to mean "one or more" unless specified otherwise or it is clear from context it is to be directed to a singular form. Also, at least one of A and B or the like generally means A or B or both A and B. Furthermore, to the extent that "includes", "having", "has", "with", or variants thereof are used, such terms are intended to be inclusive in a manner similar to the term "comprising".

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A level shifter, comprising
   a first voltage converter, having an input coupled to a first input node and an output coupled to a first node;
   a first pull-up transistor, coupled between a power node and a third node, and having a gate coupled to the first node;
   a first pull-down transistor, coupled between a fourth node and a reference node, and having a gate coupled to a first input node;
   a second voltage converter, having an input coupled to a second input node and an output coupled to a second node wherein a voltage level at the second input node is opposite to a voltage level at the first input node;
   a second pull-up transistor, coupled between the power node and the fourth node, and having a gate coupled to a second node;
   a second pull-down transistor, coupled between the third node and the reference node, and having a gate coupled to a second input node;
   a third inverter, having an input coupled to the third node and an output coupled to the fourth node; and
   a fourth inverter, having an input coupled to the fourth node and an output coupled to the third node.

2. The level shifter as claimed in claim 1, wherein
   the third inverter comprises:
      a first transistor, coupled between the power node and the fourth node and having a gate coupled to the third node; and
      a second transistor, coupled between the fourth node and the reference node and having a gate coupled to the third node; and
   the fourth inverter comprising:
      a third transistor, coupled between the power node and the third node and having a gate coupled to the fourth node; and
      a fourth transistor, coupled between the third node and the reference node and having a gate coupled to the fourth node.

3. The level shifter as claimed in claim 2, wherein
   the first voltage converter comprises:
      a fifth transistor, coupled between the power node and the first node and having a gate coupled to the first input node;
      a sixth transistor, coupled between the first node and a fifth node and having a gate coupled to a first output node, wherein the voltage level at the first output node is opposite to the voltage level at the third node; and
      a seventh transistor, coupled between the fifth node and the reference node and having a gate coupled to the first input node; and
   the second voltage converter comprising:
      an eighth transistor, coupled between the power node and the second node and having a gate coupled to the second input node;
      a ninth transistor, coupled between the second node and a sixth node and having a gate coupled to a second output node, wherein the voltage level at the second output node is opposite to the voltage level at the fourth node; and
      a tenth transistor, coupled between the sixth node and the reference node and having a gate coupled to the second input node.

4. The level shifter as claimed in claim 3, further comprising:
- an input inverter, having an input coupled to the first input node and an output coupled to the second input node;
- a first output inverter, having an input coupled to the third node and an output coupled to the first output node; and
- a second output inverter, having an input coupled to the fourth node and an output coupled to the second output node.

5. The level shifter as claimed in claim 3, wherein a voltage source increases the voltage level at the third node via the first pull-up transistor when the voltage level at the first input node is higher than a first voltage level such that the time required for the voltage level at the second output node to rise is being shortened, and wherein the voltage source increases the voltage level at the fourth node via the second first pull-up transistor when the voltage level at the first input node is lower than a second voltage level such that the time required for the voltage level at the first output node to rise is being shortened.

6. The level shifter as claimed in claim 3, wherein each of the first pull-up transistor, the second pull-up transistor, the first transistor, the third transistor, the fifth transistor and the eighth transistor is a PMOS transistor; each of the first pull-down transistor, the second pull-down transistor, the second transistor, the fourth transistor, the sixth transistor, the seventh transistor, the ninth transistor and the tenth transistor is an NMOS transistor.

7. The level shifter as claimed in claim 6, wherein the size of the first pull-up transistor and the second pull-up transistor is substantially equal to the size of the first pull-down transistor, the second pull-down transistor, the second transistor, the fourth transistor, the sixth transistor, the seventh transistor, the ninth transistor and the tenth transistor, and is substantially larger than the size of the first transistor, the third transistor, the fifth transistor and the eighth transistor.

8. The level shifter as claimed in claim 3, the first transistor, the second transistor, the first pull-up transistor, the first pull-down transistor, the fifth transistor, the sixth transistor and seventh transistor in layout is symmetrical to the third transistor, the fourth transistor, the second pull-up transistor, the second pull-down transistor, the eighth transistor, the ninth transistor and tenth transistor.

* * * * *